United States Patent
Dickinson

(10) Patent No.: US 10,115,571 B2
(45) Date of Patent: Oct. 30, 2018

(54) REAGENT DELIVERY SYSTEM FREEZE PREVENTION HEAT EXCHANGER

(71) Applicant: APPLIED MATERIALS, INC., Santa Clara, CA (US)

(72) Inventor: Colin John Dickinson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 469 days.

(21) Appl. No.: 14/696,955

(22) Filed: Apr. 27, 2015

(65) Prior Publication Data

US 2015/0357168 A1 Dec. 10, 2015

Related U.S. Application Data

(60) Provisional application No. 62/007,513, filed on Jun. 4, 2014, provisional application No. 62/065,155, filed on Oct. 17, 2014.

(51) Int. Cl.
*H01J 37/32* (2006.01)

(52) U.S. Cl.
CPC .. *H01J 37/32844* (2013.01); *H01J 37/32357* (2013.01); *H01J 37/32522* (2013.01); *Y02C 20/30* (2013.01)

(58) Field of Classification Search
None
See application file for complete search history.

(56) References Cited

U.S. PATENT DOCUMENTS

| | | | |
|---|---|---|---|
| 4,138,996 A * | 2/1979 | Cartland | F24D 11/003 126/400 |
| 4,326,499 A | 4/1982 | Koskela | |
| 6,059,567 A * | 5/2000 | Bolton | H01L 21/67109 432/152 |
| 8,165,726 B2 * | 4/2012 | Nordberg | F24H 9/2035 122/13.01 |
| 2005/0056408 A1* | 3/2005 | Gregory | F28D 1/053 165/151 |
| 2005/0155854 A1 | 7/2005 | Shufflebotham et al. | |

(Continued)

FOREIGN PATENT DOCUMENTS

| CN | 2086863 U | 10/1991 |
|---|---|---|
| CN | 201200884 Y | 3/2009 |

(Continued)

OTHER PUBLICATIONS

Machine Generated English Translation of KR20000059181A published Oct. 5, 2000.*

(Continued)

*Primary Examiner* — Sylvia MacArthur
(74) *Attorney, Agent, or Firm* — Moser Taboada; Alan Taboada

(57) ABSTRACT

Apparatus and methods that provide a reagent gas in a foreline abatement system are provided herein. In some embodiments, a reagent delivery system includes a water tank having an inner volume that holds a reagent liquid when disposed therein, and a heat exchanger having a central opening disposed in the inner volume and configured to keep a top surface of the reagent liquid from freezing when reagent liquid is disposed within the water tank.

19 Claims, 2 Drawing Sheets

(56) References Cited

U.S. PATENT DOCUMENTS

| | | | |
|---|---|---|---|
| 2006/0011324 A1 | 1/2006 | Rogers et al. | |
| 2007/0187850 A1 | 8/2007 | Tomasel et al. | |
| 2008/0099414 A1* | 5/2008 | Haslem | B01D 17/0214 |
| | | | 210/800 |
| 2009/0142720 A1* | 6/2009 | Pussell | F24H 1/205 |
| | | | 432/29 |
| 2010/0018475 A1* | 1/2010 | Arnold | F24H 1/206 |
| | | | 122/18.1 |
| 2011/0107512 A1* | 5/2011 | Gilbert | E03C 1/00 |
| | | | 4/596 |
| 2011/0135552 A1 | 6/2011 | Dickinson et al. | |
| 2015/0357168 A1* | 12/2015 | Dickinson | H01J 37/32844 |
| | | | 156/345.29 |

FOREIGN PATENT DOCUMENTS

| | | | |
|---|---|---|---|
| CN | 101625148 A | 1/2010 | |
| EP | 0222069 A2 * | 5/1987 | B01J 8/0415 |
| JP | 2005-111433 A | 4/2005 | |
| KR | 20-0427888 Y1 | 10/2006 | |
| KR | 2004-27888 Y1 | 10/2006 | |
| KR | 10-1160891 B1 | 6/2012 | |

OTHER PUBLICATIONS

Machine Generated English Translation of KR20060427888A published Oct. 2, 2006.*

Machine Generated English Translation of JP 2005-111433 published Apr. 28, 2005.*

International Search Report and Written Opinion dated Aug. 19, 2015 for PCT Application No. PCT/US2015/028398.

Search Report received from the State Intellectual Property Office of the People's Republic of China dated May 31, 2018 for China Patent Application No. 2015800267142.

* cited by examiner

US 10,115,571 B2

REAGENT DELIVERY SYSTEM FREEZE PREVENTION HEAT EXCHANGER

CROSS-REFERENCE TO RELATED APPLICATIONS

This application claims benefit of U.S. provisional patent application Ser. No. 62/007,513, filed Jun. 4, 2014, and U.S. provisional patent application Ser. No. 62/065,155, filed Oct. 17, 2014, which are herein incorporated by reference in their entirety.

FIELD

Embodiments of the present disclosure generally relate to substrate processing equipment, and more specifically, to plasma abatement systems for use with substrate processing equipment.

BACKGROUND

Remote plasma sources (RPS) or in-line plasma sources (IPS) have been used for abatement of perfluorocarbons (PFC's) and global warming gases (GWG's). For example, the RPS or IPS may be installed in a foreline of a vacuum system of a substrate processing system between a high vacuum pump, such as a turbo pump, and a backing pump, such as a dry vacuum pump. In some plasma abatement systems, a reagent delivery system (RDS), such as a water delivery system (WDS), delivers water vapor to the foreline as a reagent gas for the PFC abatement process.

The inventor has observed that the evaporation of the water in the WDS causes cooling, and as the vapor flow rate is increased, the surface of liquid water in the WDS may freeze and choke off the flow of water vapor. In addition, the inventor has observed that the scaling up of the WDS to support multiple process chambers includes increasing of the water tank size which causes the freezing problem to become more acute. Specifically, since it is more difficult to transfer heat to the inner section of the larger tank, the surface of the water in the tank is more prone to freezing.

Therefore, the inventors have provided embodiments of an improved reagent delivery system including a heat exchanger to prevent surface freezing of the reagent and allow higher reagent vapor evaporation flow rate.

SUMMARY

Apparatus and methods that provide a reagent gas in a foreline abatement system are provided herein. In some embodiments, a reagent delivery system includes a water tank having an inner volume that holds a reagent liquid when disposed therein, and a heat exchanger having a central opening disposed in the inner volume and configured to keep a top surface of the reagent liquid from freezing when reagent liquid is disposed within the water tank.

In some embodiments, a heat exchanger for use in a reagent delivery system may include a continuous coil sheet of material having an inner end and an outer end, wherein the continuous coil sheet forms a plurality of equidistantly spaced concentric layers that permits a flow of a reagent liquid between the concentric layers, and wherein the continuous coil sheet is perforated to allow water to flow through the concentric layers.

In some embodiments, a method may include providing a heat exchanger within an inner volume of a water tank of the reagent delivery system, providing a reagent liquid within the inner volume of the water tank to a level that causes the heat exchanger to be partially submerged within the reagent liquid and partially protruding from a top surface of the reagent liquid, evaporating the reagent liquid to form a reagent gas that is supplied to the foreline abatement system, wherein evaporating the reagent liquid causes the top surface of the reagent liquid to cool, and heating the top surface of the reagent liquid using the heat exchanger, wherein the heat exchanger conducts heat from a lower portion of the heat exchanger to an upper portion of the heat exchanger, and wherein the lower portion of the heat exchanger is heated by and disposed in reagent liquid having a higher temperature than the top surface of the reagent liquid.

In some embodiments, a substrate processing system may include a process chamber; a foreline coupled to the process chamber to allow a flow of exhaust from the process chamber, a foreline plasma abatement system coupled to the foreline to abate exhaust flowing through the foreline, wherein the foreline plasma abatement system includes a water tank having an inner volume that holds a reagent liquid when disposed therein, a tube disposed along a central access of the water tank, and a heat exchanger having a central opening disposed in the inner volume about the tube and configured to keep a top surface of the reagent liquid from freezing when reagent liquid is disposed within the water tank.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
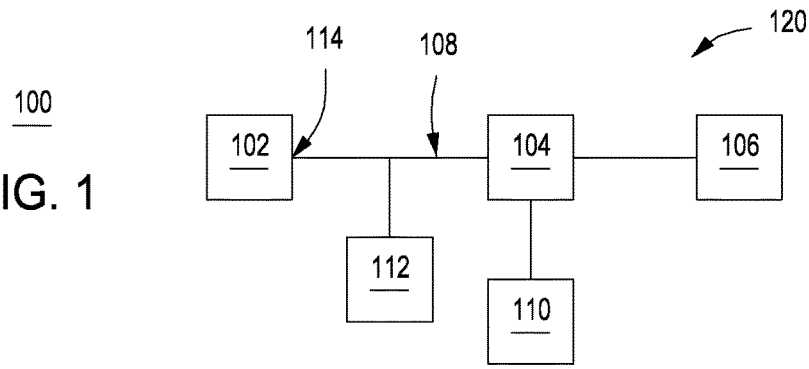
FIG. 1 depicts a processing system including a plasma foreline abatement system in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure may advantageously provide improved abatement efficiency for perfluorocarbons (PFC's) and global warming gases (GWG's) in an in-line plasma abatement system. Embodiments of the present disclosure may improve abatement efficiency by, for example, providing an improved reagent delivery system including a heat exchanger to prevent surface freezing of the reagent and allow higher reagent vapor evaporation flow rate in the foreline. In some embodiments, the reagent is water and the reagent vapor is water vapor. By preventing surface freezing of the water and allowing higher water vapor evaporation flow rate in the foreline, the breakdown of PFCs and/or GWGs by reaction with the water vapor is improved.

Additional advantages of the post-plasma foreline gas injection include the reduction in temperature of the post abatement exhaust. As the pressure and gas flow in the exhaust line can change with each step in the recipe, embodiments of this disclosure can adjust to each change in the recipe or for each operational condition to maintain optimum abatement efficiency while minimizing utilities and energy use for step. These adjustments/control can be by set parameters time-synchronized to the process recipe, by real-time sensor feedback, or by monitoring the tool or gas panel control signals. If the abatement tool is in shutdown, idle, preventative maintenance, or bypass mode, energy and utilities can be minimized by use of the smart interface between the process chamber and the abatement device. For example, the smart interface may adjust the plasma power supply output to an appropriate power level to maintain target performance. The plasma power supply and reactor tube (or other component) lifetime depend on operating energy level. Wasting power by operating at a plasma energy level higher than is warranted for the abatement or clean gas within the reactor not only wastes energy, but shortens the duration between maintenance cycles. Further the abatement RPS or Inline Abatement Device smart interface may count and report: uptime, system warnings or faults, operating efficiency, operational hours, and utilities used, and may report real time or accumulative carbon footprint performance locally or to a central monitoring and reporting system. Further embodiments of this disclosure include a reagent delivery system designed and integrated with the foreline gas injection control to maintain a specific amount of reagent injected to the exhaust pre-plasma to maintain optimum abatement efficiency of PFC or GWG and to minimize reagent consumption.

A plasma source for foreline abatement may utilize a hydrogen or oxygen containing reagent, such as water vapor, in addition to the process exhaust, to enable PFC and GWG abatement in the foreline. FIG. 1 is a piping and instrumentation diagram that shows a typical plasma foreline abatement system in accordance with some embodiments of the disclosure. The plasma foreline abatement system may be coupled to or may be part of a larger processing system that produces or emits PFC's or GWG's that involve abatement. Non-limiting examples of such systems include substrate processing systems such as those used in semiconductor, display, solar, or light emitting diode (LED) manufacturing processes.

A plasma source for foreline abatement may utilize a hydrogen or oxygen containing reagent, such as water vapor, in addition to the process exhaust, to enable PFC and GWG abatement in the foreline. FIG. 1 is a schematic view of a processing system 100 including a typical plasma foreline abatement system 120 for treating exhaust gas in accordance with some embodiments of the present disclosure. The processing system 100 generally comprises a process chamber 102, a foreline 108 coupled to the process chamber 102, a reagent delivery system 112 coupled to the foreline 108, and an apparatus for treating exhaust gas 104 (e.g., a plasma abatement source) coupled to the foreline 108.

The process chamber 102 may be any process chamber suitable to perform a process on a substrate. In some embodiments, the process chamber 102 may be part of a processing tool, for example a cluster tool, in line processing tool or the like. The process chamber 102 may produce or emit PFC's or GWG's that involve abatement. Non-limiting examples of such process chambers 102 include substrate processing systems such as those used in semiconductor, display, solar, or light emitting diode (LED) manufacturing processes.

The foreline 108 is coupled to an exhaust port 114 of the process chamber 102 and facilitates the removal of exhaust gases from the process chamber 102. The exhaust gases may be any gases, for example such as process gases or byproduct gases that may be removed from the process chamber 102. The foreline 108 may be coupled to a vacuum pump 106 or other suitable pumping apparatus to pump the exhaust gases from the process chamber 102 to appropriate downstream exhaust handling equipment (such as abatement equipment or the like). In some embodiments, the vacuum pump 106 may be a roughing pump or backing pump, such as a dry mechanical pump, or the like. In some embodiments, the vacuum pump 106 may have a variable pumping capacity with can be set at a specific level, for example, to control or provided addition control of pressure in the foreline 108.

The apparatus for treating exhaust gas 104 is disposed in-line with the foreline 108 and facilitates treatment or abatement of the exhaust gases from the process chamber 102. A power source 110, such as an RF power source, is coupled to the apparatus for treating exhaust gas 104 to provide power to the apparatus for treating exhaust gas 104 to facilitate the plasma treatment of the exhaust gases. The power source 110 provides RF energy at a frequency and power sufficient to form a plasma within the apparatus for treating exhaust gas 104 such that the exhaust gas flowing through the apparatus for treating exhaust gas 104 may be treated with the plasma (e.g., at least partially broken down into one or more of ions, radicals, elements, smaller molecules, or the like). In some illustrative embodiments, the power source 110 may be a variable frequency power source capable of providing RF energy at a range of frequencies. In some illustrative embodiments, the power source 110 may provide about 2 to about 3 kW of RF energy at a frequency of about 1.9 to about 3.2 MHz.

Figure 2:
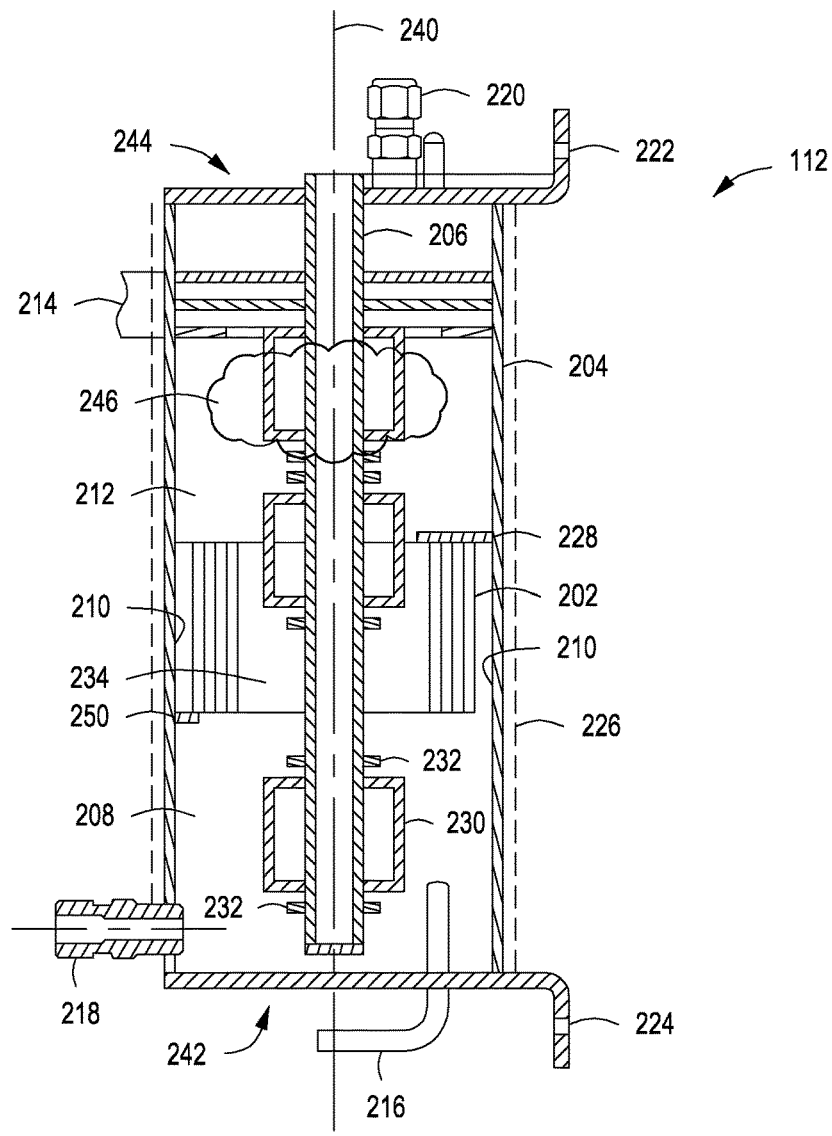
FIG. 2 depicts a side cross-section view of a reagent delivery system in accordance with some embodiments of the present disclosure.

A reagent delivery system 112 may be coupled to the foreline 108 to deliver a reagent, such as water vapor, to the foreline 108 upstream of the plasma abatement source (i.e., apparatus for treating exhaust gas 104). FIG. 2 depicts a cross-sectional side view of the reagent delivery system 112. A reagent delivery system 112 includes a water tank 204 having an inner volume 212 for storing a reagent liquid. Although referred to as a water tank, the water tank 204 may be used to hold any reagent suitable for use in the foreline abatement system 120 such as water, liquid oxygen, and the like. In some embodiments, the water tank 204 may have a wall thickness of about 0.1 inches to about 1.0 inch, and may be fabricated from aluminum, stainless steel, or a composite material. In some embodiments, the water tank 204 may have a wall thickness of about 0.125 inches to about 0.25 inches. In some embodiments, the water tank 204 may be about 4 inches in diameter to about 10 inches in diameter. In some embodiments, the water tank 204 may be about 8 inches in diameter.

In some embodiments, a tube 206 may be disposed along an axis, such as central axis 240, within water tank 204. In some embodiments the tube 206 may be disposed along an offset axis. The tube 206 provides a level tree assembly with electrical/magnetic reed switches/sensors to be inserted so that the liquid level can be detected. Not all embodiments described herein include the tube. In some embodiments, the tube 206 may have a diameter of about 0.25 inches to about 1.0 inches and be formed from stainless steel or other suitable material. In some embodiments, the tube 206 may have a diameter of about 0.5 inches. In some embodiments, the tube 206 is a fully blind tube, is sealed and the inside of the tube is not exposed to any vapor. The tube 206 may be supported within water tank 204 via an upper mounting bracket 222. The upper mounting bracket 222, which forms the lid of the water tank 204, may support the reagent delivery system 112 along with a lower mounting bracket 224 in a desired position.

The water tank 204 may include a liquid reagent level sensing system to determine the level of the liquid reagent. In embodiments, liquid reagent level sensing system may include one or more magnetic floats 230 disposed in the water tank 204. In embodiments that include the tube 206, the one or more magnetic floats 230 are disposed about tube 206 as shown in FIG. 2. Each of the one or more magnetic floats 230 may move between a pair of magnetic float stops 232. The position of each magnetic float 230 provides an indication of the liquid reagent level within the water tank 204. The magnetic float 230 will sit on a bottom stop until the liquid reagent causes the magnetic float 230 to float. The magnetic float 230 will stop when the magnetic float 230 reaches a top stop. Sensors 252 that are disposed within the tube 206 will monitor the position of each magnetic float. In some embodiments, reagent liquid, such as water, will be flowed for a specific time period (e.g., 12 seconds) into water tank 204 based on the position of one or more of the magnetic floats 230. In some embodiments, three magnetic floats may be disposed within water tank 204 as shown in FIG. 2.

In embodiments that don't include the tube 206, the one or more magnetic floats 230 may be disposed in water tank 204 and may be configured to float at different levels within the water tank 204. Sensors 252 may be disposed along the inner or outer surfaces of the water tank 204 to monitor the position of each magnetic float. In other embodiments, other types of liquid reagent level sensing systems may be used.

The reagent delivery system 112 may include a reagent inlet 216 for providing a reagent liquid 208 to the inner volume 212 of water tank 204. The reagent inlet 216 may be a solenoid or an orifice in some embodiments. In some embodiments, the reagent inlet 216 may be disposed through a bottom portion 242 of water tank 204. In some embodiments, the lower mounting bracket 224 may form the bottom portion 242 of water tank 204, and the reagent inlet 216 may be disposed through the lower mounting bracket 224. Water tank 204 may further include a maintenance drain 218 disposed proximate the bottom portion 242 of the water tank 204. The maintenance drain 218 may be used to drain the reagent liquid 208 from water tank 204. In some embodiments, water tank 204 include a maintenance vent 220 disposed through a top portion 244 of the water tank. In some embodiments, the upper mounting bracket 222 may form the top portion 244 of water tank 204, and the maintenance vent 220 may be disposed through the upper mounting bracket 222.

The reagent delivery system 112 may also include a plurality of baffles 214 disposed proximate an upper end of water tank 204. The baffles 214 may be used to separate liquid reagent (e.g., water) vapor droplets from dry steam. Baffles 214 form a liquid separator to prevent liquid water splashing into the vapor delivery line. In some embodiments, the reagent delivery system 112 may include a heater blanket 226 to help control the temperature within the inner volume 212 of water tank 204.

In some embodiments, the reagent/water vapor is emitted through a tube 248 connected to the upper mounting bracket 222 of the water tank. The reagent/water vapor passes through baffles 214 which have holes in them. Reagent/water vapor entering the top head space above the baffles 214 of inner volume 212 is emitted out of tube 248. In other embodiments, the tube 206 may include blind holes to allow the evaporated reagent vapor to flow into and up through the central portion of the tube 206 and be provided to the foreline abatement system 120.

In the reagent delivery system 112, the reagent liquid 208, for example water, is introduced into the inner volume 212 of water tank 204 via reagent inlet 216. The reagent liquid 208 (e.g., water) is evaporated to produce water vapor 246 which is used as a reagent gas in the foreline abatement system 120. In some reagent delivery systems, the inventor has observed that the evaporation of the water in the WDS causes cooling, and as the vapor flow rate is increased, the liquid surface 210 of liquid water in the reagent delivery system 112 may freeze and choke off the flow of water vapor. Thus, the inventive reagent delivery system 112 provided herein includes a heat exchanger 202 disposed within water tank 204. In some embodiments, the heat exchanger 202 may be a perforated baffle heat exchanger that is disposed at the reagent liquid surface 210 to ensure effective heat transfer from the reagent liquid 208 to the liquid surface 210 of the reagent liquid that is subject to evaporated cooling. More specifically, the heat exchanger 202 may be a metal sheet baffle that is partly submerged in the reagent liquid 208 and partly protruding from the liquid surface 210 to account for liquid level change and water boiling affects.

By disposing heat exchanger 202 as such, surface freezing of the reagent liquid 208 is prevented and higher water vapor evaporation flow rates are achieved. More specifically, the inventor has observed that there is a steep temperature gradient towards the liquid surface 210. For example, water freezing at 0° C. could occur at the surface while the temperature of the water could be around 35° C. just 3.5 mm below the surface of the water. Arranging the heat exchanger 202 through the liquid surface 210 breaks up the small zone of high temperature gradient by arranging for heat transfer across this zone to the surrounding fluid. Thus, the heat exchanger 202, which is fabricated from a material having high thermal conductivity properties, equalizes temperature at the liquid surface 210 to inhibit water freezing due to evaporated cooling by transferring the heat from the warmer liquid below to the surface to the surface of the liquid. In some embodiments, the thermal conductivity of the material used for the heat exchanger is greater than 10 k. In some embodiments, the thermal conductivity of the material used for the heat exchanger is as high as 400 W/mK.

The heat exchanger 202 may have a central opening 234 such that the heat exchanger 202 may be disposed about tube 206, and optionally about magnetic float 230. Heat exchanger 202 may be retained within water tank 204 via one or more support bars 228. In some embodiments, three support bars 228 may be used to support heat exchanger 202 within water tank 204. The support bars 228 may be tack welded, or otherwise fastened, to an inner wall of water tank 204. Support bars 228 may also be used to retain the shape of heat exchanger 202 as will be described below in further detail. The heat exchanger 202 is installed within water tank 204 at the normal reagent liquid level such that the heat exchanger 202 is disposed partially submerged in the reagent liquid. In some embodiments, the heat exchanger 202 may be supported by one or more protrusions 250 (e.g., ring, ledge, pins, pegs, etc.), that extend radially inward from an inner wall of the water tank 204. In alternative embodiments, the heat exchanger 202 is from a buoyant material coated with a material have a high thermal conductivity, that allows the heat exchanger 202 to float such that the heat exchanger 202 is partially submerged in the reagent liquid and partially protruding from the surface of the reagent liquid.

Figure 3:
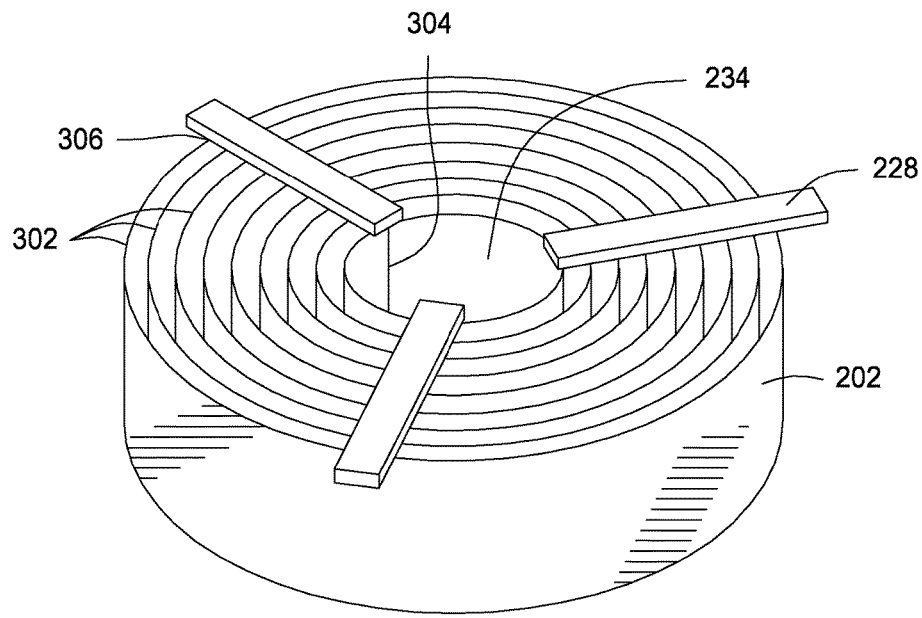
FIG. 3 depicts an isometric view of a heat exchanger for use in the reagent delivery system of FIG. 2 in accordance with some embodiments of the present disclosure.

The heat exchanger 202 is further shown in FIGS. 3-6. Specifically, FIG. 3 detects an isometric view of heat exchanger 202. As shown in FIG. 3, heat exchanger 202 may be formed as a continuous coil/spiral metal sheet having an inner end 304 and an outer end 306. In some embodiments, the heat exchanger 202 may have a height of about 25 mm to about 100 mm. An inner diameter of the coil may start at a 2 inch diameter to form central opening 234. The heat exchanger 202 may include a plurality of equidistantly spaced concentric coil layers 302 to allow the flow of the reagent liquid between the layers. In some embodiments, each layer may be spaced approximately 0.25 inches from each other. The support bars 228 may be tack welded to hold the coil to ensure concentricity of the inner to outer diameter of heat exchanger 202. In some embodiments, the heat exchanger may be formed from stainless steel (e.g., 304 stainless steel, 16 gauge stainless steel). In some embodiments, each coil layer 302 may be 0.25 inches thick. In some embodiments, the stainless steel maybe perforated to allow water to flow between the coil layers 302 without causing channeling or any other hydraulic affects.

Figure 4:
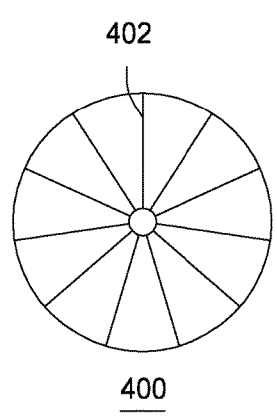
FIG. 4 depicts a top schematic view of a heat exchanger for use in the reagent delivery system of FIG. 2 in accordance with some embodiments of the present disclosure.
Figure 5:
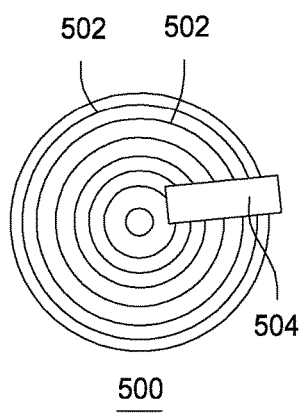
FIG. 5 depicts a top schematic view of a heat exchanger for use in the reagent delivery system of FIG. 2 in accordance with some embodiments of the present disclosure.
Figure 6:
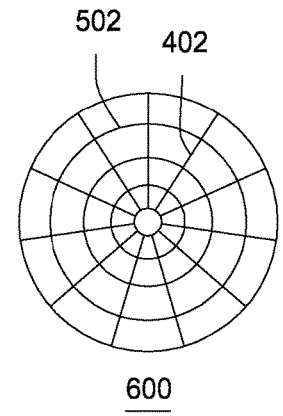
FIG. 6 depicts a top schematic view of a heat exchanger for use in the reagent delivery system of FIG. 2 in accordance with some embodiments of the present disclosure.

As shown in FIG. 4-6, other configurations of the heat exchanger 202 may be used. Specifically, the heat exchanger 400 in FIG. 4 depicts a plurality of radially extending fins 402. The heat exchanger 500 in FIG. 5 depicts a plurality of concentric cylinders 502 that may be secured together by one or more support bars 504. The heat exchanger 600 in FIG. 6 depicts both radio and concentric configurations to form a honeycomb type structure. Other types of structures, for example square folded sheets, may be used.

While the foregoing is directed to embodiments of the present disclosure, other and further embodiments of the disclosure may be devised without departing from the basic scope thereof.

The invention claimed is:

1. A reagent delivery system, comprising:
a water tank having an inner volume that holds a reagent liquid when disposed therein; and
a heat exchanger having a central opening disposed in the inner volume and configured to keep a top surface of the reagent liquid from freezing when reagent liquid is disposed within the water tank,
wherein the heat exchanger is formed from a plurality of concentric cylinders that permits a flow of a reagent liquid between the concentric cylinders, and wherein each of the plurality of concentric cylinders is perforated to allow the reagent liquid to flow through the concentric cylinders.

2. The reagent delivery system of claim 1, wherein the plurality of concentric cylinders are secured together by one or more radial support bars coupled to the plurality of concentric cylinders, and wherein the one or more support bars ensure concentricity of the plurality of concentric cylinders.

3. The reagent delivery system of claim 2, wherein the one or more radial support bars further secure the heat exchanger to an inner wall of the water tank and extend radially to a center portion of the heat exchanger.

4. The reagent delivery system of claim 1, wherein the heat exchanger is supported by one or more protrusions extending radially inward from an inner wall of the water tank and extend radially to a center portion of the heat exchanger.

5. The reagent delivery system of claim 1, wherein the heat exchanger includes a plurality of radial fins extending radially inward from an inner wall of the cylinder.

6. The reagent delivery system of claim 1, further comprising:
one or more magnetic floats configured to float in the reagent liquid; and
one or more sensors disposed in the water tank, where the one or more sensors are configured to determine a level of the reagent liquid based on a position of the magnetic float.

7. The reagent delivery system of claim 6, further comprising:
a tube disposed along a central access of the water tank, wherein the heat exchanger and the one or more magnetic floats are disposed about the tube, and wherein the one or more sensors are disposed within the tube.

8. The reagent delivery system of claim 1, wherein each of the plurality of concentric cylinders are solid sheets of metal having perforations formed therethrough.

9. A heat exchanger for use in a reagent delivery system, comprising:
a continuous coil sheet of material having an inner end and an outer end, wherein the continuous coil sheet forms a plurality of equidistantly spaced concentric layers that permits a flow of a reagent liquid between the concentric layers, and wherein the continuous coil sheet is perforated to allow the reagent liquid to flow through the concentric layers.

10. The heat exchanger of claim 9, further comprising:
one or more radial support bars coupled to the continuous coil sheet that ensures concentricity of equidistantly spaced concentric layers.

11. The heat exchanger of claim 10, wherein the one or more radial support bars further secure the heat exchanger within the reagent delivery system and extend radially to a center portion of the heat exchanger.

12. The heat exchanger of claim 9, wherein the continuous coil sheet is formed from stainless steel.

13. The heat exchanger of claim 9, wherein the continuous coil sheet has an inner diameter at the inner end of about 2 inches, and an outer diameter at the outer end of about 8 inches.

14. The heat exchanger of claim 9, wherein each concentric layer is spaced about 0.25 inches from each other.

15. The heat exchanger of claim 9, wherein the continuous coil sheet is a solid sheet of metal having perforations formed therethrough.

16. A substrate processing system, comprising:
a process chamber;
a foreline coupled to the process chamber to allow a flow of exhaust from the process chamber;

a foreline plasma abatement system coupled to the foreline to abate exhaust flowing through the foreline, wherein the foreline plasma abatement system includes:
- a water tank having an inner volume that holds a reagent liquid when disposed therein; and
- a heat exchanger having a central opening disposed in the inner volume and configured to keep a top surface of the reagent liquid from freezing when reagent liquid is disposed within the water tank, wherein the heat exchanger is a continuous coil sheet of material having an inner end and an outer end, wherein the continuous coil sheet forms a plurality of equidistantly spaced concentric layers that permits a flow of a reagent liquid between the concentric layers, and wherein the continuous coil sheet is perforated to allow the reagent liquid to flow through the concentric layers.

17. The substrate processing system of claim 16, further comprising:
- one or more magnetic floats configured to float in the reagent liquid; and
- one or more sensors disposed in the water tank, where the one or more sensors are configured to determine a level of the reagent liquid based on a position of the magnetic float.

18. The substrate processing system of claim 17, further comprising:
- a tube disposed along a central access of the water tank, wherein the heat exchanger and the one or more magnetic floats are disposed about the tube, and wherein the one or more sensors are disposed within the tube.

19. The substrate processing system of claim 16, wherein the continuous coil sheet is a solid sheet of metal having perforations formed therethrough.

\* \* \* \* \*